(12) United States Patent
Tokuhara et al.

(10) Patent No.: US 6,549,414 B1
(45) Date of Patent: Apr. 15, 2003

(54) COMPUTERS

(75) Inventors: Tsunemi Tokuhara, Tokyo (JP); Masaaki Takizawa, Tokyo (JP); Mikio Fukushima, Tokyo (JP)

(73) Assignee: Cybernetics Technology Co., Ltd., Tokyo (JP)

( * ) Notice: Subject to any disclaimer, the term of this patent is extended or adjusted under 35 U.S.C. 154(b) by 0 days.

(21) Appl. No.: 09/573,851

(22) Filed: May 19, 2000

(30) Foreign Application Priority Data

Sep. 24, 1999 (JP) .............................. 11-270016
Mar. 22, 2000 (JP) ........................... 2000-079710

(51) Int. Cl.[7] .............................................. H05K 7/20
(52) U.S. Cl. .................... 361/719; 361/702; 361/703; 361/704; 174/16.3; 165/80.3; 165/185
(58) Field of Search ................. 361/683–687, 361/690–692, 697–700, 704–710, 719–721; 174/15.1, 15.2, 16.3; 165/80.3, 80.4, 185

(56) References Cited

U.S. PATENT DOCUMENTS

| 5,440,450 A | * | 8/1995 | Lau et al. ..................... 361/695 |
|---|---|---|---|
| 5,671,120 A | * | 9/1997 | Kikinisi ........................ 165/46 |
| 5,731,954 A | * | 3/1998 | Cheon .................... 165/104.33 |
| 5,765,483 A | * | 6/1998 | Ohashi et al. ......... 165/104.33 |
| 6,021,044 A | * | 2/2000 | Neville et al. ......... 165/104.33 |
| 6,088,223 A | * | 7/2000 | Diemunsch ................. 174/15.2 |
| 6,122,166 A | * | 9/2000 | Mochizuki et al. ..... 165/104.33 |
| 6,141,215 A | * | 10/2000 | Podwalny et al. ........... 361/687 |
| 6,175,501 B1 | * | 1/2001 | Bortolini et al. ............ 174/16.3 |
| 6,324,056 B1 | * | 11/2001 | Breier et al. ................ 165/80.3 |

* cited by examiner

*Primary Examiner*—Boris Chervinsky
(74) *Attorney, Agent, or Firm*—Wenderoth, Lind & Ponack, L.L.P.

(57) ABSTRACT

A low cost computer is suitable for small size configuration. Casings 4 and 32 are formed by aluminum, which is a heat radiating material, and CPUs 6 and 36, hard disk devices 8 and 38, control ICs 40 and 42 and a memory IC are mounted on the casing 4 directly or by the heat radiating material. The casings 4 and 32 are utilized as heat radiators, thereby making the entire computer a smaller size.

5 Claims, 7 Drawing Sheets

COMPUTERS

BACKGROUND OF THE INVENTION

The present invention relates.to personal computers or computers for servers to be used for configuration of computer networks.

Heretofore, a personal computer that radiates heat generated from electronic equipment and component parts built in a casing with a radiator made of an aluminum sheet was disclosed in an official gazette of Japanese patent laid-open publication No. H-11-145665 and the like. Furthermore, cooling of the heat of electronic equipment and component parts of the computer by a fan has been carried out in the past.

The servers to be used in networks are driven continuously for 24 hours, and how to deal with heat radiation is an essential condition. Although the conventional servers have built-in radiators or fans in the casing to radiate the heat of a hard disk or CPU, this radiation configuration leads to the problem of a bigger structure of the entire computer system, and moreover, it leads to the problem of increased cost.

An object of the present invention is to solve the foregoing problems.

SUMMARY OF THE INVENTION

The present invention provides computers suitable for a small size at low cost. A CPU and hard disk are provided; in a casing, and the casing constitutes a radiator sheet made of aluminum. The CPU and the hard disk device are mounted on an inner wall surface of the casing. The heat generated at the CPU and the hard disk device is absorbed by the casing so that the casing inhibits temperature increases in the CPU and the, hard disk device.

Furthermore, the present invention is so configured that the CPU, hard disk device, control IC and memory IC are provided in the casing, and a circuit substrate is fixed in the casing. The CPU, control IC and memory IC are disposed on the circuit substrate. The casing is made from the radiating sheet of aluminum, and the hard disk device is fixed to a support sheet made of aluminum that tightly adheres to the casing. The heat generated at the hard disk device is transmitted to the casing through the support sheet and is absorbed by the casing. The control IC and the memory IC adhere to a heat sink sheet made of aluminum that is fixed to the casing, and the heat generated at the control IC and the memory IC is transmitted to the casing through the heat sink sheet and is absorbed by the casing. The CPU tightly adheres to a heat sink block made of aluminum, one heat pipe made of a radiating metallic material adheres to this heat sink block, and an other heat pipe comes into contract with the casing. The heat generated at the CPU is transmitted to the casing through the heat sink block and the heat pipe, and is absorbed by the casing. The casing is integrally formed with heat radiating fins. The other heat pipe comes into contact with the vicinity of a portion of the heat radiating fins.

DETAILED DESCRIPTION OF THE INVENTION

A mode of an embodiment of the present invention will be described in detail in the following by referring to attached drawings.

Figure 1:
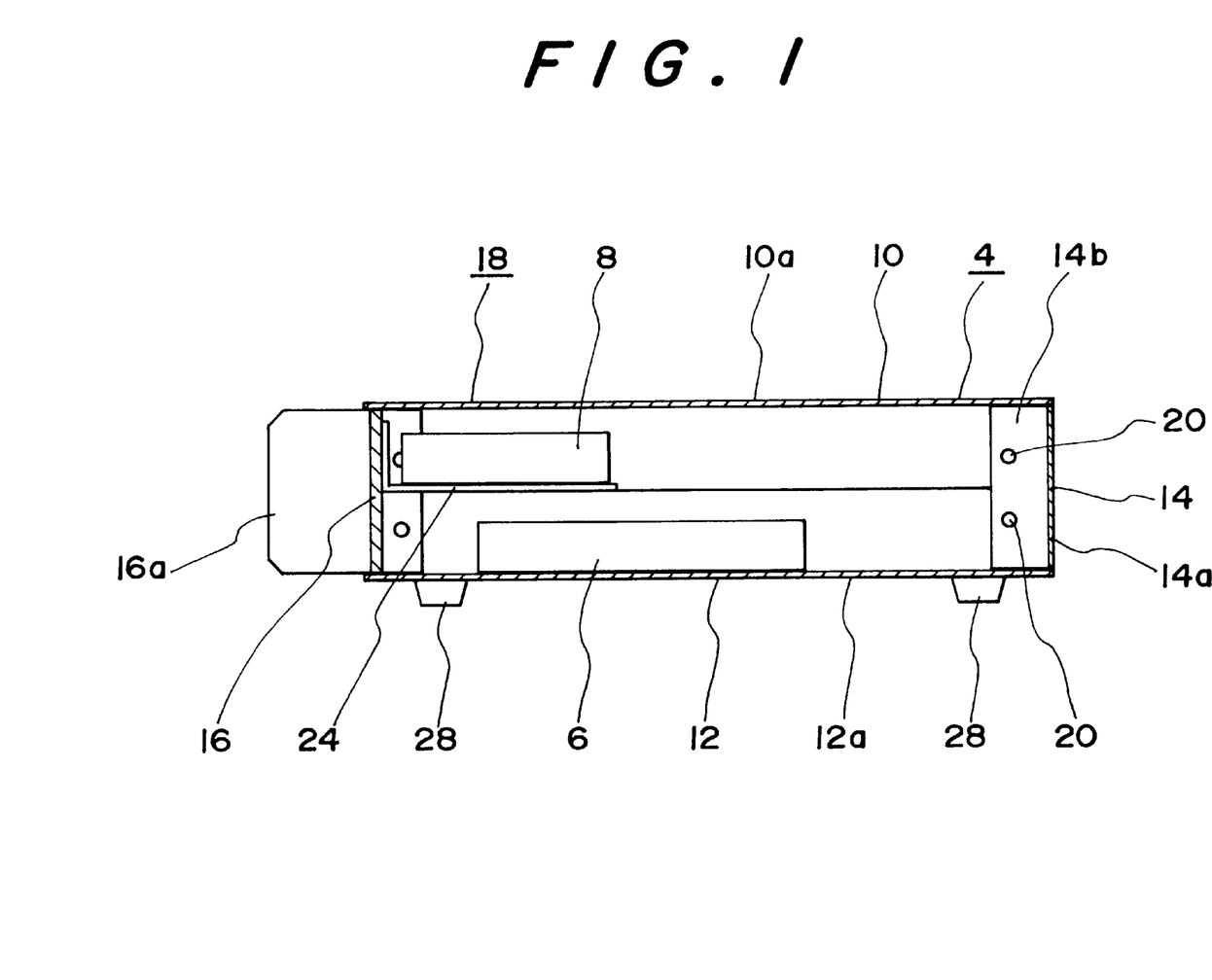
FIG. 1 denotes a cross section showing an embodiment of the present invention.
Figure 2:
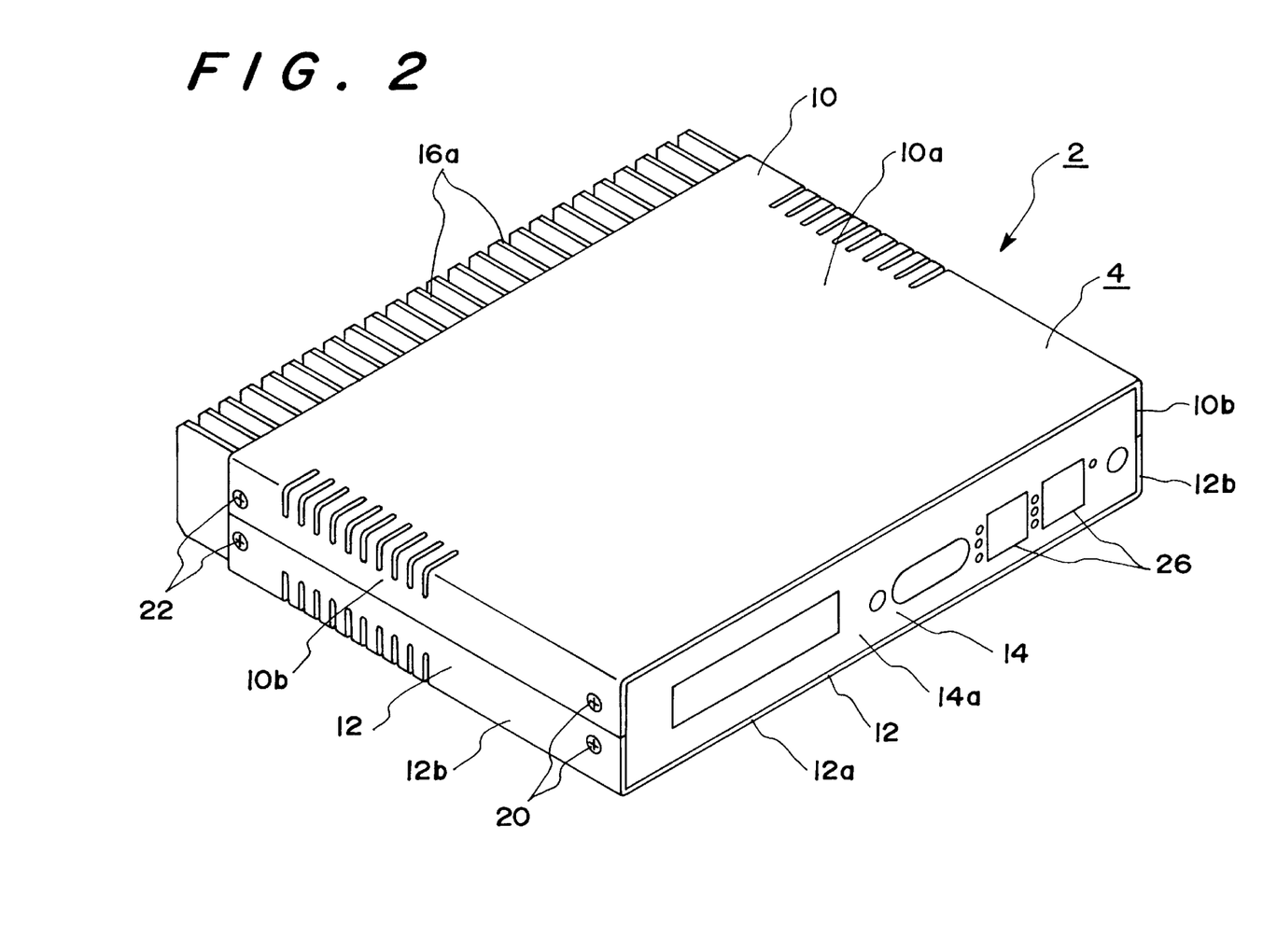
FIG. 2 perspective view of a personal computer to be used as a server.

Reference numeral 2 denotes a server to be used for configuration of a computer network, and is operated continuously for 24 hours with a power source turned on. The server 2 is so constructed that a CPU- 6, hard disk device 8, and electronic equipment and component parts (illustration is omitted) such as a control IC, memory IC and the like which are required for the computer are provided in the casing 4.

The casing 4 comprises a top cover 10, bottom cover 12, transverse panel 14, and a rear panel 16, and all of them are made of aluminum that is a heat radiating material (i.e. heat radiating aluminum sheet). The top cover 10 and the bottom cover 12 are formed with side sheets 10b, 10b and side sheets 12b, 12b forming a right angle to flat sheets 10a, 12a of the covers at both side portions respectively. The covers and panels thus constitute aluminum rational plates.

The top cover 10 and the bottom cover 12 are joined with the side sheets 10b, 10b and side sheets 12b, 12b to form a frame body 18 whose front and rear portions are open. At the front open portion of the frame body 18, the transverse panel 14 is fitted. At both sides of the transverse panel 14, a mounting side sheet 14b (the other sheet is not illustrated) that is at a right angle to a flat sheet 14a is formed. The mounting side sheets 14b come into contact with the side sheets 10b, 10b and the side sheets 12b, 12b of the frame body 18, and are fixed to the side sheets 10b, 10b and the side sheets 12b, 12b by means of screws 20.

At the rear open portion of the frame body 18, a rear panel 16 is fitted and fixed to a rear portion of the frame body 18 by means of screws 22. The rear panel 16 is integrally formed with heat radiating fins 16a. On an inner wall surface of the rear panel 16 is screwed an angle 24 made of aluminum, and the body proper of the hard disk device 8 is fixed to the angle 24.

On the inner wall surface of the flat sheet 12a of the bottom cover 12, the body proper of the CPU 6 is bonded by means of grease. Furthermore, all of the other electronic equipment and component parts for configuration of the server 2 are fixed to the casing 4. On the transverse panel 14, a connector 26 for connection of a variety of external equipment to the server 2 is mounted. On the wall surface of the flat sheet 12a of the bottom cover 12 are fixed four conically shaped rubber bases 28 are mounting the server 2 on a desk.

In the foregoing configuration, the heat generated from the CPU 6 and the hard disk device 8 at the time of driving the server is transmitted to the casing 4, and is radiated outside from the casing 4. Since the casing 4 is constituted by the aluminum, the heat is efficiently absorbed and radiated, and the tendency toward high temperatures of the CPU 6 and the hard disk device 8 is prevented.

Another mode of embodiment of the present invention will be described in the following by referring to FIG. 3 through FIG. 7.

Figure 3:
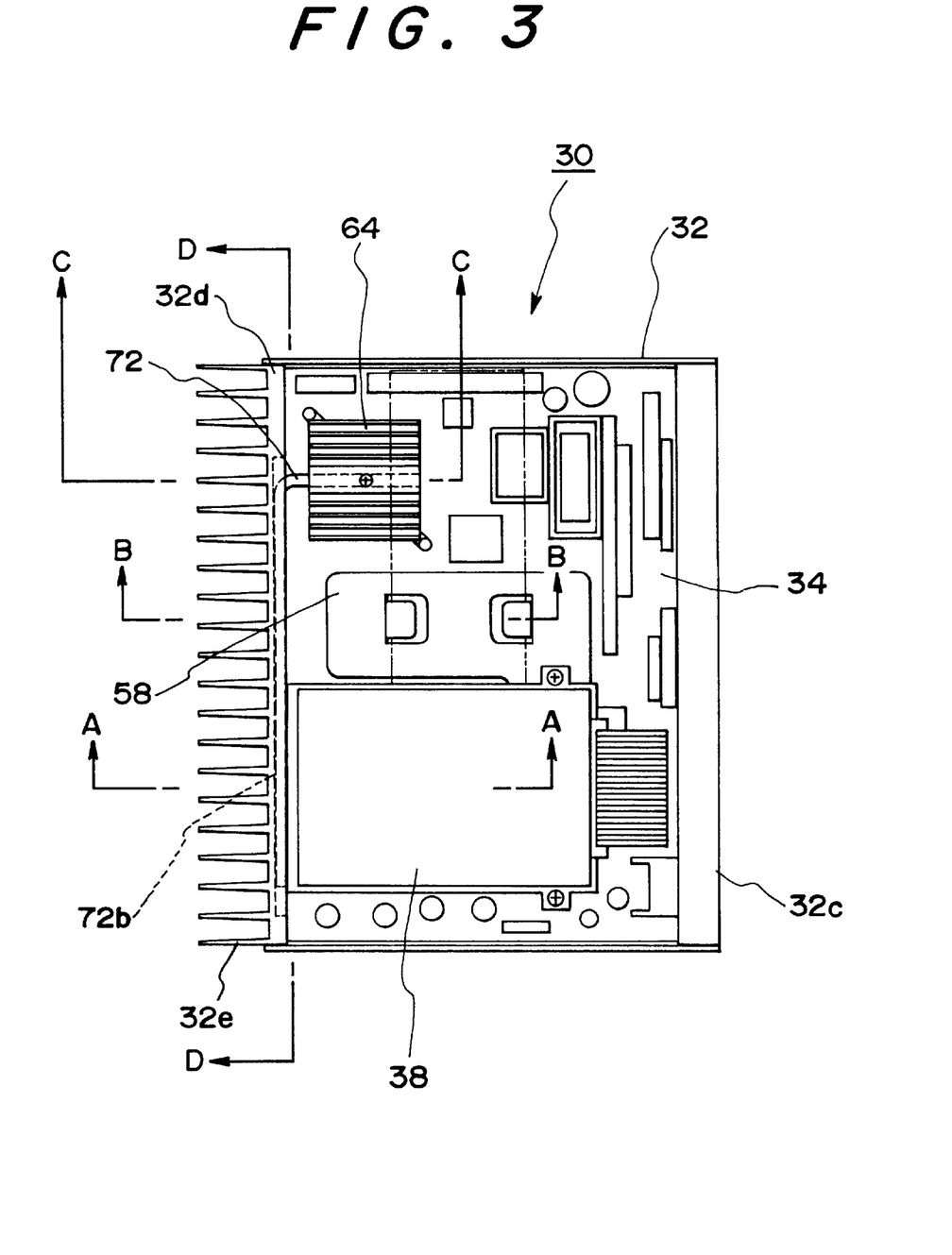
FIG. 3 denotes a plan view of an inner structure of another embodiment of a personal computer, from which a top cover has been removed.

Reference number 30 denotes a server to be used for configuration of a computer network. A circuit substrate 24, CPU 6, hard disk device 3 8, control ICs (integrated circuit) 40, 42, memory IC 44 and electronic equipment and component parts (illustration is omitted) which are required as a computer are provided in the casing 32.

The casing 32 comprises a top cover 32a, bottom cover 32b, traverse panel 32c, and a rear panel 32d that is integrally formed with heat radiation fins 32e. All of these elements are made from aluminum sheets that are heat radiation metallic material. The casing 32 is of almost identical construction with the casing 4 of the first embodiment.

Figure 4:
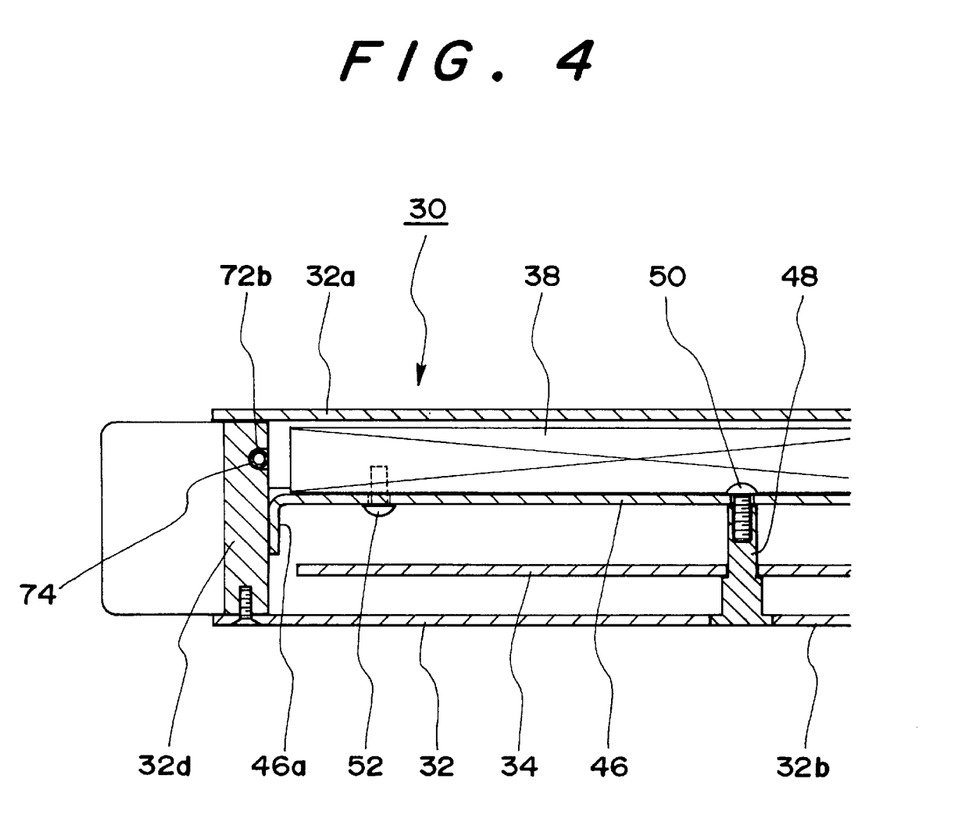
FIG. 4 denotes an A—A line cross section.

The circuit substrate 34, in which a variety of electronic equipment and electronic circuit component parts are incorporated, is horizontally disposed at a proper interval from the bottom cover 32b, and is fixed to a mounting shaft (illustration is omitted) made of brass, which is fixed to the bottom cover 32b by means of a screw. Reference numeral 46 denotes a support sheet made of aluminum, and is disposed above the circuit substrate 34 at a proper interval, and one angle portion 46a is made to tightly adhere to a perpendicular inner wall of the rear panel 32d.

The support sheet 46 is fixed to an upper end of a mounting shaft 48 made of brass, which is fixed to the bottom cover 32b by means of a screw 52.

Figure 5:
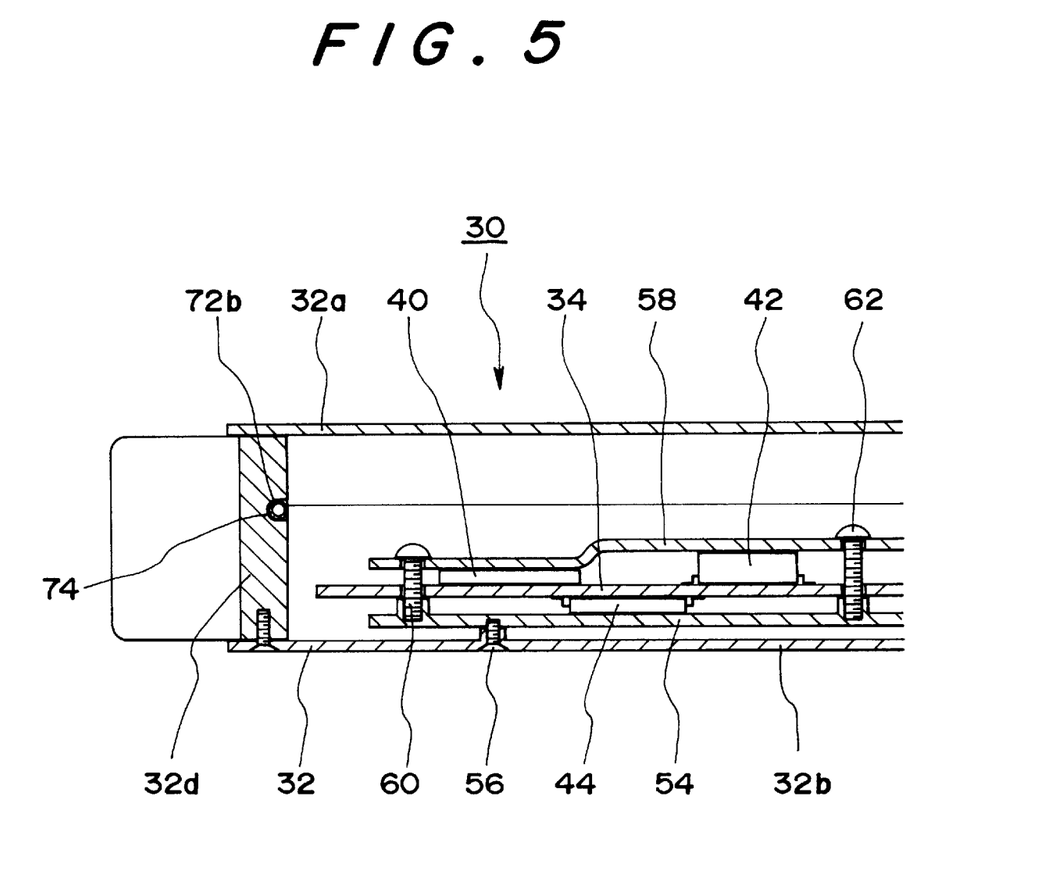
FIG. 5 denotes a A—A line cross section.

A mounting structure of the control IC 40 and the memory IC 44 is described in the following by referring to FIG. 5.

Reference numeral 54 denotes a lower level heat sink sheet made of aluminum, and is horizontally fixed to the bottom cover 32b by means of a screw 56. The memory IC 44 disposed on the lower surface of the circuit substrate 34 is sandwiched by the lower level heat sink sheet 54 and the circuit substrate 34. In the upper part of the circuit substrate 34, an upper level heat sink sheet 58 made of aluminum is disposed, and the control IC 40 and 42 are sandwiched by the upper level heat sink sheet 58 an the circuit substrate 34.

The upper level heat sink sheet 58 is fixed to the lower level heat sink sheet 54 by means of screws 60 and 62. The control ICs 40 and 42 disposed on the upper surface of the circuit substrate 34 adhere tightly to the heat sink surface of the upper level heat sink sheet 58. The heat of the heat sink sheet 58 is arranged to be transmitted to the heat sink sheet 54 through the screws 60 and 62, which are thermal conductors.

Figure 6:
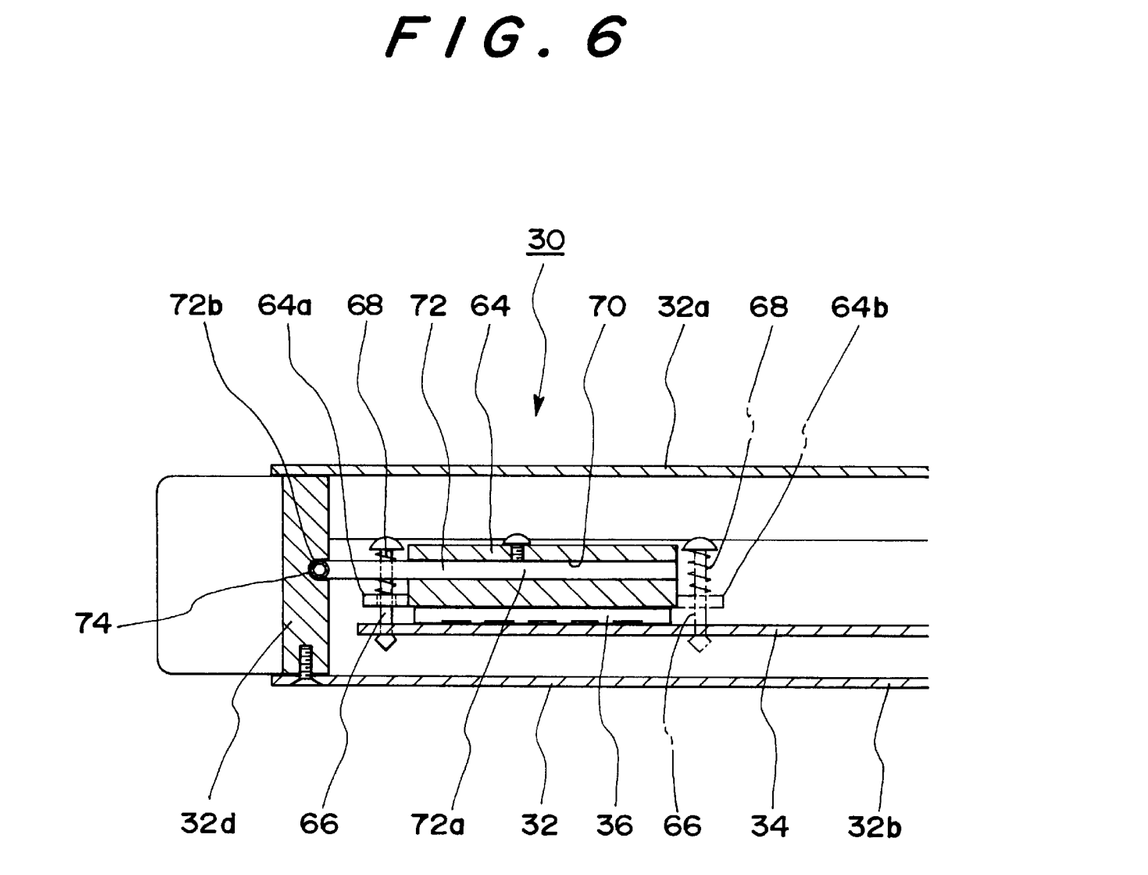
FIG. 6 denotes a C—C line cross section.

A mounting structure of the CPU 36 will be described in the following by referring to FIGS. 6 and 7.

The CPU 36 is fixed integrally to a metallic part of the circuit substrate 34 by means of soldering. Reference number 64 denotes a heat sink block made of aluminum, and heat radiating fins are integrally formed with the heat sink block. The heat sink block 64 is disposed in tight contact with the upper surface of the CPU 36, and mounting shafts 66 fixed to the circuit substrate 34 are inserted into holes of mounting members 64a and 64b of the heat sink block 64.

Coil springs 68 are mounted on the mounting shafts 66, and the lower surface of the heat sink block 64 adheres tightly to the upper surface of the CPU 36 by a resilient force of these coil springs 68, with a head portion of the mounting shafts 66 being a fulcrum. A lateral hole 70 is bored in the heat sink block 64, and one part 72a of a heat pipe 72 is fitted into the lateral hole 70. The heat pipe 72 is made from copper, which is a heat radiating metallic material, and silicone grease is filled in its inside.

Figure 7:
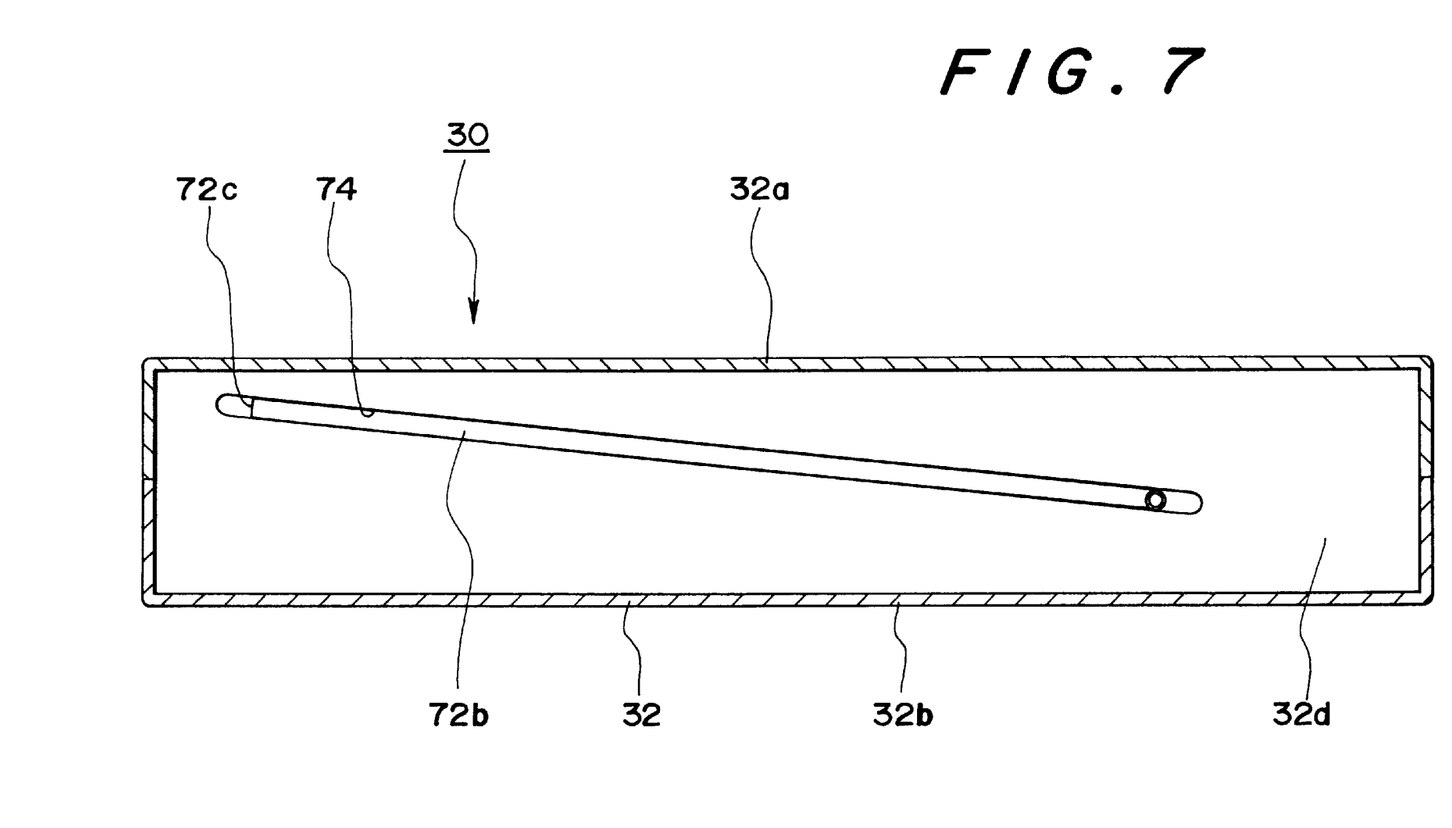
FIG. 7 denotes a D—D line cross section.

Another part 72b of the heat pipe 72 is curved in an almost right angular direction relative to the one part 72a, and also, as shown in FIG. 7, is inclined upward about 20 degrees toward the other end 72c. The other part 72b that is inclined upward is fitted into a heat pipe inserting groove 74 formed with an inclination upward about 20 degrees toward the other side from the one side on the inner wall surface of the rear panel 32d. An upward inclination structure along the groove 72 of the other part 72b of the heat pipe 72 improves thermal conductivity efficiency along the heat pipe 72 and elevates the heat radiating effect.

In the foregoing configuration, the heat generated at the hard disk device 38 is transmitted to the casing 32 through the support sheet 46 and is absorbed by the casing 32, and thus the temperature rise of the hard disk device 38 is inhibited. Furthermore, the heat generated at the control IC 40 and 42 is transmitted to the casing 32 through the heat sink sheet 58, screws 60 and 62 and the heat sink sheet 54 and is absorbed by the casing 32.

Furthermore, the heat generated at the memory IC 44 is transmitted to the casing 32 and is absorbed by the casing 32 so that the temperature rise of the control ICs 40 and 42 and the memory IC 44 is inhibited. Furthermore, the heat generated at the CPU 36 is transmitted to the casing 32 through the heat sink block 64, heat pipe 72, and is absorbed by the casing 32 so that the temperature rise of the CPU 36 is inhibited.

The present invention is constructed as described in the foregoing by making the casing itself as a heat radiating sheet and mounting the CPU and the hard disk device on the casing, thereby reducing the size of the computer to a small size-and manufacturing it at a lower cost.

What is claimed is:

1. A computer comprising:
   a casing made of heat radiating aluminum sheet, said casing including a bottom cover made of an aluminum radiation plate and a rear panel made of an aluminum radiation plate having fins;
   an aluminum angle fixed to said rear panel inside said casing;
   a CPU device mounted on an inner wall surface of said bottom cover made of an aluminum radiation plate such that heat generated by said CPU is absorbed by said bottom cover of said casing; and
   a hard disk device mounted on said aluminum angle fixed to said rear panel such that heat generated by said hard disk device is absorbed by said rear panel of said casing.

2. A computer comprising:
   a casing made of heat radiating aluminum sheet, said casing including a front panel made of an aluminum radiation plate, a rear panel made of an aluminum radiation plate having integrally formed fins and an insertion groove, a top cover made of an aluminum radiation plate and a bottom cover made of an aluminum radiation plate;
   a circuit substrate fixed with respect to said casing;
   a CPU, a control IC and a memory IC disposed on said circuit substrate;

a support sheet of aluminum which adheres tightly to said casing;

a hard disk device fixed to said support sheet;

at least one aluminum heat sink sheet fixed to said casing, wherein at least one of said control IC and said memory IC adheres tightly to said at least one aluminum heat sink sheet;

an aluminum heat sink block, wherein said CPU adheres tightly to said aluminum heat sink block; and a heat pipe made of a heat radiating metallic material which has a first portion adhering tightly to said heat sink block and a second portion fitted in said insertion groove of said rear panel so that heat from said CPU can be absorbed by said rear panel and dispersed by said fins of said rear panel.

3. The computer of claim 2, wherein said support sheet of aluminum is fixed to said rear panel.

4. The computer of claim 2, wherein said at least one aluminum heat sink sheet comprises two aluminum heat sink sheets having said circuit substrate therebetween.

5. The computer of claim 4, wherein said control IC tightly adheres to one of said aluminum heat sink sheets and said memory IC tightly adheres to the other of said aluminum heat sink sheets.

* * * * *